United States Patent
Kasai

(10) Patent No.: US 8,976,985 B2
(45) Date of Patent: Mar. 10, 2015

(54) ACOUSTIC SENSOR AND MICROPHONE

(75) Inventor: Takashi Kasai, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 13/378,327

(22) PCT Filed: Mar. 18, 2011

(86) PCT No.: PCT/JP2011/056587
§ 371 (c)(1),
(2), (4) Date: Nov. 4, 2013

(87) PCT Pub. No.: WO2012/114539
PCT Pub. Date: Aug. 30, 2012

(65) Prior Publication Data
US 2014/0050338 A1    Feb. 20, 2014

(30) Foreign Application Priority Data
Feb. 23, 2011   (JP) ................................. 2011-036904

(51) Int. Cl.
H04R 25/00    (2006.01)
(52) U.S. Cl.
USPC ............................ 381/174; 381/191; 381/396
(58) Field of Classification Search
USPC .......................... 381/174–176, 190–191, 396
See application file for complete search history.

(56) References Cited

U.S. PATENT DOCUMENTS

| | | |
|---|---|---|
| 2007/0047746 A1 | 3/2007 | Weigold et al. |
| 2008/0157301 A1 | 7/2008 | Ramakrishna et al. |
| 2010/0155864 A1 | 6/2010 | Laming et al. |
| 2010/0290648 A1 | 11/2010 | Zhang |

FOREIGN PATENT DOCUMENTS

| | | |
|---|---|---|
| CN | 201467442 U | 5/2010 |
| JP | 62-213400 A | 9/1987 |
| JP | 2008-005439 A | 10/2008 |
| JP | 2010-056745 A | 3/2010 |

OTHER PUBLICATIONS

Japanese Office Action for Application No. 2011-036904, issued Feb. 19, 2013. (6 pages).
Extended European Search Report for Application No. 11788759.6 issued Feb. 11, 2014 (7 Pages).
Chinese Office Action for Application No. 201180002517.9 issued Jun. 30, 2014 (10 pages).

*Primary Examiner* — Suhan Ni
(74) *Attorney, Agent, or Firm* — Nutter McClennen & Fish LLP; John J. Penny, Jr.; Michael P. Visconti, III

(57) ABSTRACT

Provided is an acoustic sensor capable of improving an S/N ratio of a sensor without preventing reduction in size of the sensor. A diaphragm 43 as a movable electrode plate is formed on the top surface of a silicon substrate 42. The diaphragm 43 has a rectangular form, and four corners and midsections of long sides of the diaphragm 43 are supported by anchors 46. A displacement of the diaphragm 43 is minimal on a line D that connects between the anchors 46 at the midsections of the long sides. A displacement maximal point G, at which a displacement is maximal, is present on each side of the line D, and the line D extends in a direction intersecting with a line connecting between the displacement maximal points G.

15 Claims, 22 Drawing Sheets

Fig. 1 (PRIOR ART)
(A)
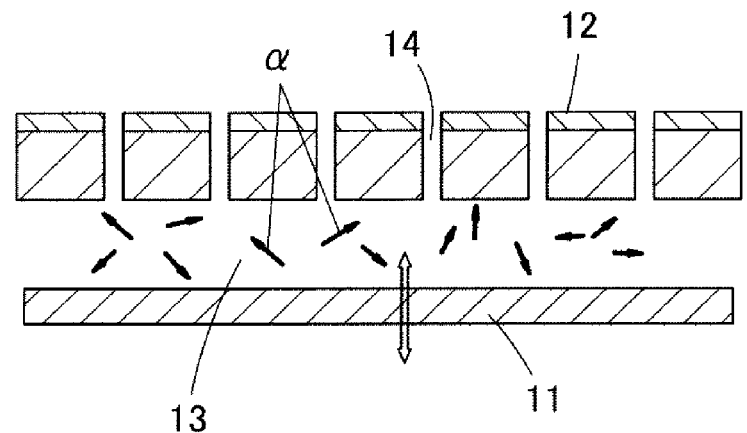
(B)
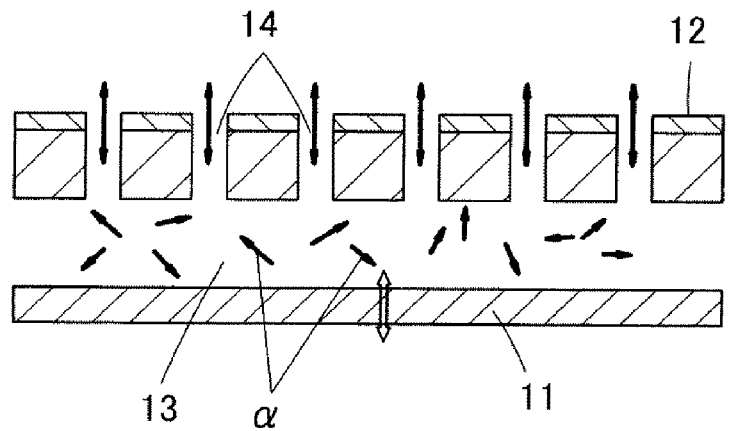

Fig. 10
(A)
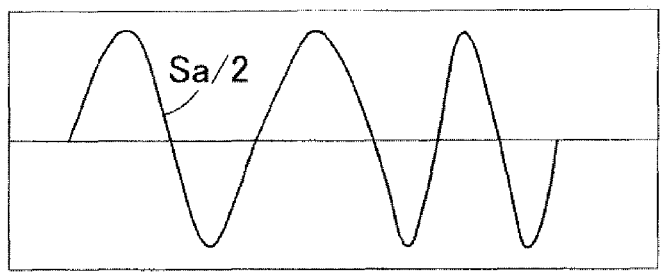
(B)
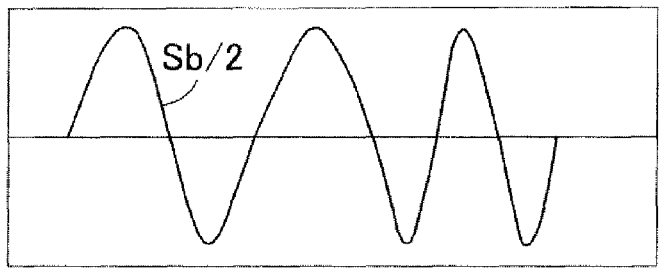
(C)
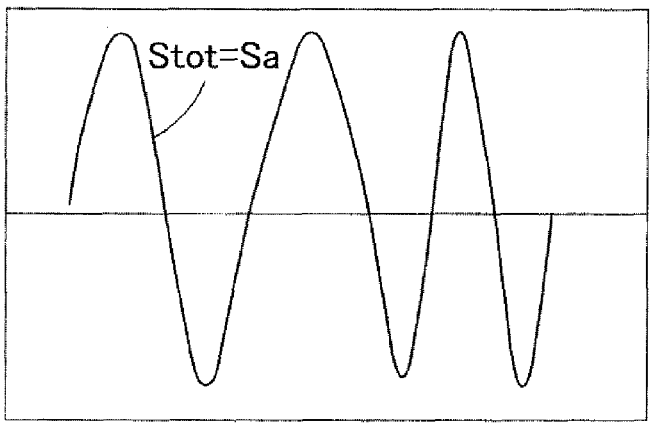

ACOUSTIC SENSOR AND MICROPHONE

TECHNICAL FIELD

The present invention relates to an acoustic sensor and a microphone. Specifically, the present invention relates to an acoustic sensor of a capacitance type, manufactured by means of MEMS (Micro Electro Mechanical System) technique or micromachining technique. Further, the present invention relates to a microphone using the acoustic sensor.

BACKGROUND ART

Microphones have been used in a variety of equipment such as mobile phones and IC recorders. An acoustic sensor built in each of such microphones is required to have an improved S/N ratio and a reduced size.

As a method for increasing an S/N ratio of the acoustic sensor, first, there is a method of increasing sensitivity of the acoustic sensor. In order to increase the sensitivity of the acoustic sensor of the capacitance type, there can be adopted a method of widening an area of a diaphragm and a method of reducing spring properties of the diaphragm to increase a displacement amount of the diaphragm. However, in the former method of widening the area of the diaphragm, reduction in size of the acoustic sensor is hindered. Further, in such a method of decreasing the spring properties of the diaphragm as the latter method, since the displacement amount of the diaphragm increases, the durability of the acoustic sensor decreases.

A second method for increasing the S/N ratio of the acoustic sensor is to reduce noise of the acoustic sensor. As the noise of the acoustic sensor of the capacitance type, thermal noise generated in an air gap formed between the diaphragm (movable electrode plate) and a back plate (fixed electrode plate) is problematical.

The thermal noise in the air gap is noise generated by a mechanism as shown in FIG. 1(A). As shown in FIG. 1(A), air molecules α present inside an air gap 13 between a diaphragm 11 and a back plate 12, namely a semi-enclosed space, are collided with the diaphragm 11 due to fluctuations (thermal motion). Microforce due to the collision with the air molecules α is applied to the diaphragm 11, and the microforce applied to the diaphragm 11 fluctuates at random. Therefore, the diaphragm 11 vibrates due to the collision with the air molecules α, to generate electric noise in a vibration sensor. Especially in a highly sensitive acoustic sensor or microphone, noise attributed to such thermal noise is large, and the S/N ratio thus deteriorates.

The noise attributed to such thermal noise can be alleviated by increasing an opening ratio of an acoustic hole 14 opened in the back plate 12 as shown in FIG. 1(B), to facilitate passage of air inside the air gap 13 through the acoustic hole 14. Further, the noise can also be alleviated by widening the air gap 13 between the diaphragm 11 and the back plate 12. However, when the opening ratio of the acoustic hole 14 is increased or the air gap 13 is widened, a capacitance of a capacitor configured of the diaphragm 11 and the back plate 12 decreases. For this reason, with the method of simply reducing noise, the sensitivity of the acoustic sensor decreases simultaneously with reduction in noise, and hence it has not been possible to improve the S/N ratio of the acoustic sensor.

(Conventionally Known Vibration Sensor)

Patent Document 1 discloses a microphone of a difference sensing system aimed at improving the S/N ratio. As shown in FIG. 2, in this microphone 21, two acoustic sensors 23a, 23b are provided on one substrate 22, and vertical conforms of both sensors 23a, 23b are inverted to each other. That is, in one acoustic sensor 23a, a fixed plate 25a having acoustic holes 26a is formed above a diaphragm 24a, to constitute a capacitor for acoustic sensing. In the other acoustic sensor 23b, a diaphragm 24b is formed above a fixed plate 25b having acoustic holes 26b, to constitute a capacitor for acoustic sensing.

With sensing signals outputted from the diaphragms 24a, 24b in the acoustic sensors 23a, 23b, when both acoustic sensors 23a, 23b detect the same acoustic vibration, sensing signals with phases displaced 180° are outputted from both sensors 23a, 23b. The output of the acoustic sensor 23a and the output of the acoustic sensor 23b are inputted into a signal processing circuit (ASIC), and subjected to subtraction processing inside the signal processing circuit. This results in adding up of the acoustic detection signals detected by both sensors 23a, 23b, whereby the detection sensitivity of the microphone 21 improves, and the S/N ratio is expected to improve.

In such a microphone of the difference sensing system, the detection sensitivity thereof decreases unless phases, frequencies and sensitivities of acoustic detection signals detected by the two acoustic sensors are completely the same. However, making characteristics of the acoustic sensors, separately formed on the same substrate, uniform is difficult. Further, when polarities of the capacitors in both sensors 23a, 23b are opposite to each other as in this microphone, producing two equivalent acoustic sensors 23a, 23b is difficult due to a parasitic capacitance. It has thus been difficult in practice to improve the S/N ratio in such a microphone as in Patent Document 2.

Further, in such a microphone, noise derived from mismatching tends to be generated, and hence there are limitations on improvement in S/N ratio.

Moreover, an extra computing function needs to be added to the signal processing circuit, which results in high cost of the signal processing circuit. There has also been a problem in that reduction in size of the microphone is difficult because of the need to provide a plurality of acoustic sensors on the substrate.

(Another Conventionally Known Vibration Sensor)

Patent Document 2 discloses another conventional microphone. This microphone 31 basically has a similar structure to that of the microphone 21 of Patent Document 1. As shown in FIG. 3(A), in the microphone 31 of Patent Document 2, a plurality of independent acoustic sensors 33a, 33b, ... having the same structure are provided on a common substrate 32. That is, any of the acoustic sensors 33a, 33b, ... is formed with a diaphragm 34 as opposed to the top surface of a fixed plate 35 in which acoustic holes 36 are opened. Further, as shown in FIG. 3(B), a signal processing circuit 37 is provided on the top surface of the substrate 32, and an output of each of the acoustic sensors 33a, 33b, ... is connected to the signal processing circuit 37 through an electrode leader 38 wired on the substrate 32. In the case of this microphone 31, with each of the acoustic sensors 33a, 33b, ... having the same structure, the output of each of the acoustic sensors 33a, 33b, ... is subjected to addition processing in the signal processing circuit 37 so that the improvement in S/N ratio is expected.

However, even the microphone described in Patent Document 2 has a problem as follows. Since warpage that occurs in the diaphragm in the microphone producing process varies, variations in sensitivity among each acoustic sensor tend to be large. On the other hand, when the variations are intended to be made smaller, the productivity of the microphone decreases. Further, there has been a problem in that, when the electrode leader that connects between each of the acoustic sensors and the signal processing circuit on the substrate becomes longer, a parasitic capacitance and parasitic resistance of the microphone become larger, to cause deterioration in characteristics such as the sensitivity.

Moreover, since the plurality of independent acoustic sensors are provided, disagreement of the acoustic characteristics other than the sensitivity tend to occur among each sensor. For example, since the frequency characteristics, phases and the like are influenced by a back chamber and a vent hole of each sensor, each sensor tends to have different characteristics.

In the microphone of Patent Document 2, variations in sensitivity and other acoustic characteristics in each acoustic sensor tends to occur as thus described, and it has thus been difficult in practice to obtain the effect of improvement in S/N ratio.

Further, since the plurality of independent acoustic sensors needs to be arranged in array on the substrate, there has been a problem of the microphone being not reducible in size.

RELATED ART DOCUMENT

Patent Document

Patent Document 1: Japanese Unexamined Patent Publication No. 2008-5439
Patent Document 2: US Patent Publication No. 2007/0047746

SUMMARY OF THE INVENTION

Problems to be Solved by the Invention

The present invention was made in view of the technical problems as described above, and has an object to provide an acoustic sensor capable of improving an S/N ratio of a sensor without preventing reduction in size of the sensor, and a microphone using the acoustic sensor.

Means for Solving the Problem

An acoustic sensor according to the present invention is an acoustic sensor including: a substrate, having a hollow section; a thin film-like diaphragm, arranged above the substrate so as to cover the hollow section; a movable electrode plate, formed on the diaphragm; a back plate, fixed to a top surface of the substrate so as to be opposed to the diaphragm; and a fixed electrode plate, provided on the back plate in a position opposed to the movable electrode plate, characterized in that the diaphragm is supported by a supporting section to the substrate or the back plate, the diaphragm has points, at which a displacement amount is maximal at the time of vibration, and the supporting section is present on a straight line intersecting with a line segment that connects between adjacent maximal points at which the displacement amount of the diaphragm is maximal. In addition, the movable electrode plate may be provided on the diaphragm, or the diaphragm itself may serve as a movable electrode plate.

In the acoustic sensor of the present invention, the diaphragm has points, at which a displacement amount is maximal at the time of vibration, in a plurality of places, and the supporting section is present on a straight line intersecting with a line segment that connects between adjacent maximal points at which the displacement amount of the diaphragm is maximal, whereby the rigidity of the diaphragm is high on the straight line intersecting with the line segment that connects between the adjacent maximal points. Therefore, a displacement amount at the time of vibration at one maximal point out of the adjacent maximal points resists being transmitted to another maximal point through the straight line intersecting with the line segment that connects between the adjacent points at which a displacement amount is maximal. This results in mutual independence of capacitors (acoustic sensing section in embodiments) each configured of the movable electrode plate and the fixed electrode plate on each side of an area partitioned by the straight line intersecting with the line segment that connects between the adjacent maximal points.

According to such an acoustic sensor, when the respective capacitors are parallelly connected, noise can be reduced without substantial deterioration in sensitivity, so as to improve the S/N ratio of the acoustic sensor. Further, the diaphragm is just divided into a plurality of independently vibratable areas, thereby not preventing reduction in size of the acoustic sensor.

In the acoustic sensor according to the present invention, the diaphragm is partially supported at intervals by a plurality of the supporting sections provided on the substrate or the back plate. According to such an embodiment, the rigidity of the diaphragm can be made low as compared with the case of the whole perimeter of the diaphragm being supported by the supporting section, so as to improve the sensitivity of the acoustic sensor.

In still another embodiment of the acoustic sensor according to the present invention, the diaphragm has a plurality of outwardly extended beam sections, and each beam section is supported by the supporting sections. According to such an embodiment, even when the number of places of the diaphragm which are supported by the supporting sections increases, the rigidity of the diaphragm tends not to increase, thereby allowing an increase in sensitivity of the acoustic sensor.

In still another embodiment of the acoustic sensor according to the present invention, the diaphragm has a rectangular form. Although the diaphragm may have a rectangular form, a disk form, or some other form, the linearity of output of the acoustic sensor becomes favorable when the diaphragm has the rectangular form.

In still another embodiment of the acoustic sensor according to the present invention, the diaphragm is supported by a plurality of the supporting sections arranged in grid form. For example, it is essential only that the diaphragm having a rectangular form be supported by the supporting sections at four corners and further supported by the supporting section located at an intermediate portion between the corners, and the intermediate portion is located on two opposite sides of the rectangular form of the diaphragm. According to such an embodiment, in the diaphragm, each area surrounded by four supporting points has the maximal point of the displacement, and is substantially independently vibratable area.

In still another embodiment of the acoustic sensor according to the present invention, a periphery of the diaphragm is supported by the supporting section, and the diaphragm is further supported by at least three supporting sections along the straight line intersecting with the line segment that connects between the adjacent maximal points at which the displacement amount of the diaphragm is maximal. According to such an embodiment, it is possible to increase the rigidity of the diaphragm along the straight line intersecting with the line segment that connects between the adjacent maximal points, so as to enhance the independency of each area of the diaphragm.

In still another embodiment of the acoustic sensor according to the present invention, distance between the supporting sections located on the straight line intersecting with the line segment that connects between the adjacent maximal points at which the displacement amount of the diaphragm is maximal is shorter than distance between two supporting sections located at opposite corners of the diaphragm. In this case, a whole perimeter of a periphery of the diaphragm may be supported by the supporting section provided on the substrate or the back plate. According to such an embodiment, it is possible to increase the rigidity of the diaphragm along the straight line intersecting with the line segment that connects between the adjacent maximal points, so as to enhance the independency of each area of the diaphragm.

One embodiment of the acoustic sensor according to the present invention is characterized in that the diaphragm is divided by the slit. According to such an embodiment, both sides of the diaphragm with the slit provided therebetween can independently vibrate, so that the number of independently vibrating areas of the diaphragm can be increased. Especially when the slit is formed in the diaphragm on a line that connects between two of said supporting section, it is possible to enhance the independency of each area of the diaphragm which are separated by the supporting sections.

In still another embodiment of the acoustic sensor according to the present invention, a width of the slit is not larger than 10 μm. In an MEMS acoustic sensor of a general size, when the width of the slit exceeds 10 μm, a roll-off frequency may become as high as 500 Hz to cause deterioration in low-frequency characteristics, and hence the width of the slit is desirably not larger than 10 μm.

In still another embodiment of the acoustic sensor according to the present invention, length of the slit is not smaller than a half of a diameter of the diaphragm. When the length of the slit is shorter than a half of the width of the diaphragm, the discontinuity of the displacement between each area of the diaphragm divided by the slit is impaired, and the effect of reducing noise deteriorates as a whole, whereby the length of the slit is desirably not smaller than a half of the diameter of the diaphragm in the extending direction of the slit.

In still another embodiment of the acoustic sensor according to the present invention, a void is formed between the diaphragm and the substrate in at least one place between the adjacent supporting sections. According to such an embodiment, the void between the supporting sections can be used as a ventilation hole.

Still another embodiment of the acoustic sensor according to the present invention is characterized in that an acoustic vibration reaches the diaphragm through the hollow section. According to such an embodiment, since the hollow section inside the semiconductor substrate serves as a front chamber and a space outside the acoustic sensor serves as a back chamber, a volume of the back chamber can be made large, so as to improve the sensitivity of the acoustic sensor.

A microphone according to the present invention is a microphone provided with: the acoustic sensor according to the present invention; and a circuit for processing a signal outputted from the acoustic sensor. With the microphone of the present invention using the acoustic sensor of the present invention, it is possible to improve the S/N ratio of the microphone.

It is to be noted that the means for solving the above problems in the present invention has features in appropriate combination of the above described constitutional elements, and the present invention enables a large number of variations by combination of such constitutional elements.

BRIEF DESCRIPTION OF THE DRAWINGS

FIGS. 1(A) and 1(B) are schematic views for explaining thermal noise of an acoustic sensor.

FIG. 10(A) is a waveform diagram showing a sensitivity signal outputted from the acoustic sensor when only the one acoustic sensing section is applied with an acoustic vibration. FIG. 10(B) is a waveform diagram showing a sensitivity signal outputted from the acoustic sensor when only the other acoustic sensing section is applied with an acoustic vibration. FIG. 10(C) is a waveform diagram showing a sensitivity signal outputted from the acoustic sensor when both acoustic sensing sections are simultaneously applied with an acoustic vibration.

EMBODIMENT FOR CARRYING OUT THE INVENTION

Hereinafter, a preferred embodiment of the present invention will be described with reference to the attached drawings.

However, the following embodiments of the present invention are not restrictive, and a variety of changes in design can be made within the range not deviating from the gist of the present invention.

First Embodiment

Figure 2:
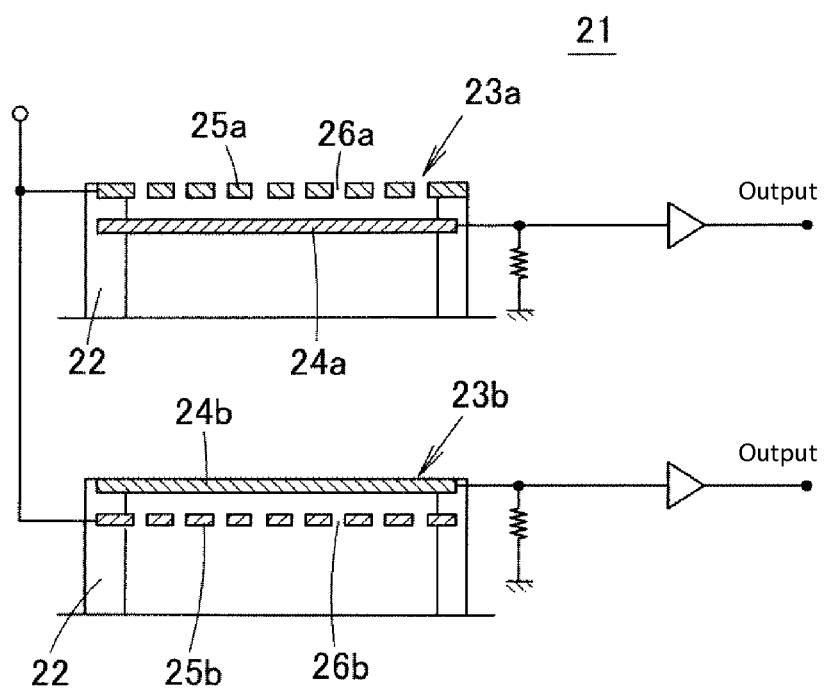
FIG. 2 is a schematic explanatory view of a microphone disclosed in Patent Document 1.
Figure 3:
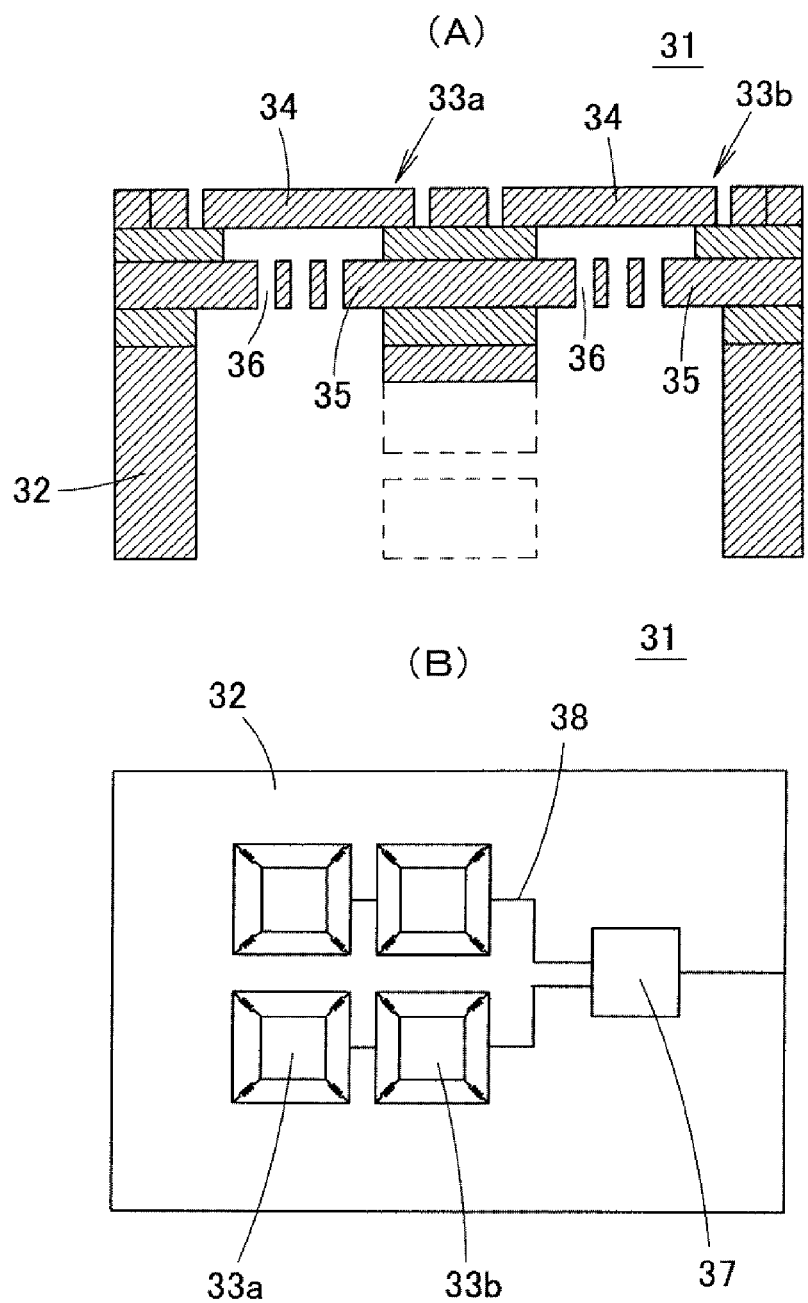
FIGS. 3(A) and (B) are a sectional view and a plan view of a microphone disclosed in Patent Document 2.
Figure 4:
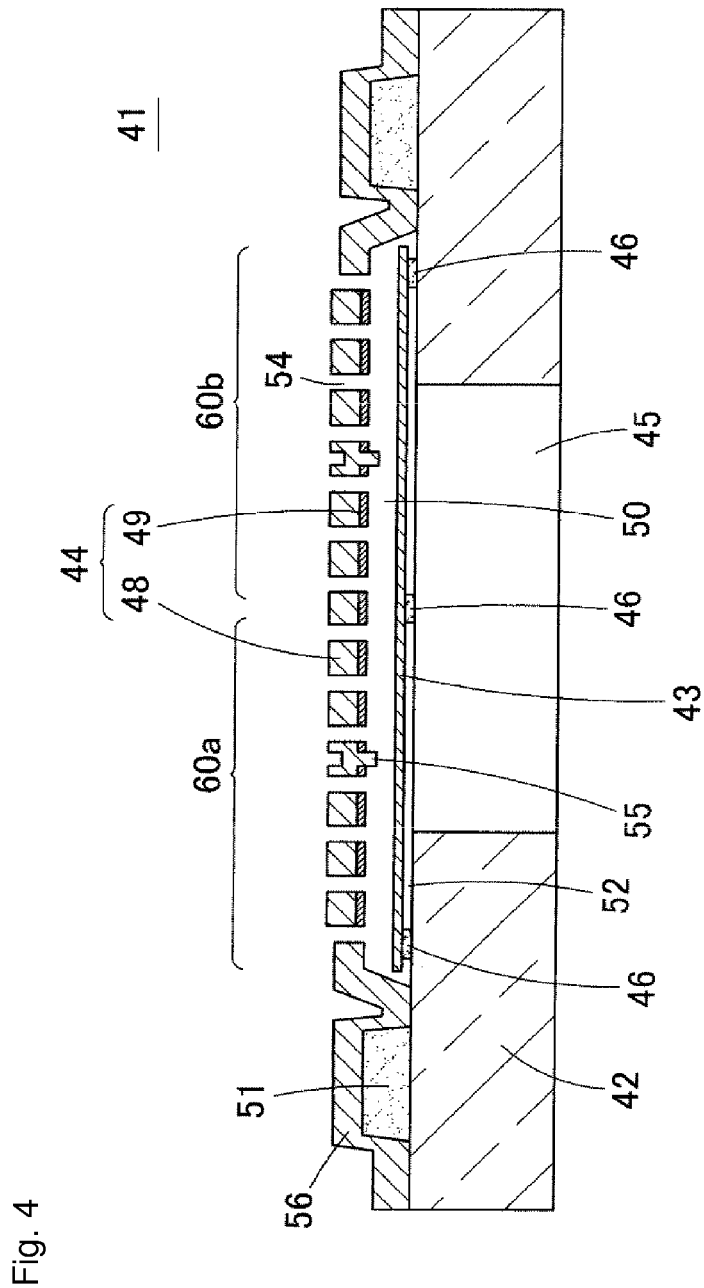
FIG. 4 is a sectional view of an acoustic sensor according to Embodiment 1 of the present invention.
Figure 5:
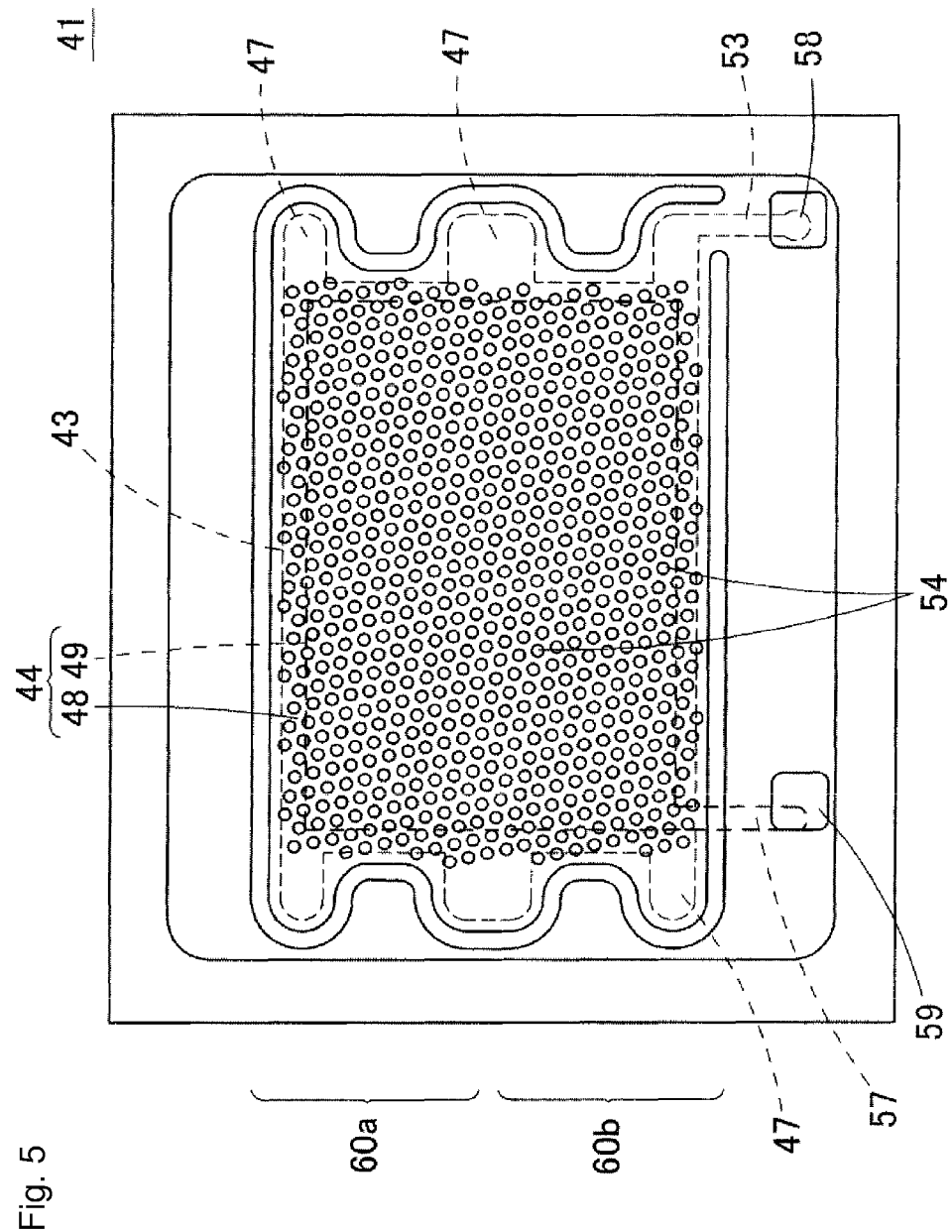
FIG. 5 is a plan view of the acoustic sensor of Embodiment 1.
Figure 6:
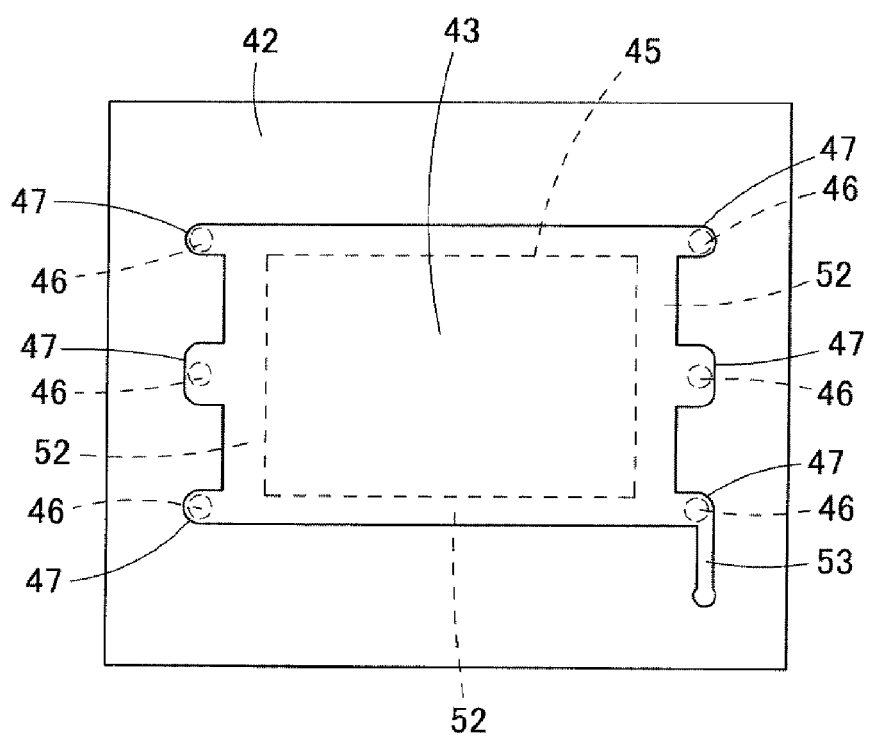
FIG. 6 is a plan view showing a form of a diaphragm in the acoustic sensor of Example 1.

A structure of an acoustic sensor according to Embodiment 1 of the present invention will be described with reference to FIGS. 4 to 6. FIG. 4 is a cross section showing an acoustic sensor 41 of Embodiment 1. FIG. 5 is a plan view of the acoustic sensor 41. Further, FIG. 6 is a plan view of a state where a canopy section 44 has been removed from the acoustic sensor 41.

This acoustic sensor 41 is a capacitance type element produced through use of the MEMS technique. As shown in FIG. 4, in the acoustic sensor 41, a diaphragm 43 (vibration electrode plate) is provided on the top surface of a silicon substrate 42 (semiconductor substrate) via anchors 46 (supporting sections), and the canopy section 44 is provided thereon via a minute air gap 50 (void).

In the silicon substrate 42 made up of single-crystal silicon, a back chamber 45 (hollow section) penetrating from the front surface to the back surface is opened. The inner peripheral surface of the back chamber 45 may be a vertical surface or be inclined in taper form.

A plurality of anchors 46 for supporting the under surface of an outer edge of the diaphragm 43 are provided on the top surface of the silicon substrate 42. Further, on the top surface of the silicon substrate 42, a base section 51 is formed so as to surround the diaphragm 43. The anchor 46 and the base section 51 are formed of $SiO_2$.

As shown in FIG. 6, the diaphragm 43 is formed in substantially rectangular form. The diaphragm 43 is formed of a polysilicon thin film having conductivity, and the diaphragm 43 itself serves as a movable electrode plate. A beam section 47 protrudes from each of four corners of the diaphragm 43 and each of the centers of short-side edges thereof. The diaphragm 43 is arranged on the silicon substrate 42 so as to cover a space above the back chamber 45, and the six beam sections 47 are supported by the anchors 46. Therefore, the diaphragm 43 is supported in the air, and between the adjacent anchors 46, a narrow vent hole 52 for allowing passage of an acoustic vibration is formed between the lower surface of the outer periphery of the diaphragm 43 and the top surface of the silicon substrate 42. Further, a leading wire 53 is extended outwardly from the diaphragm 43.

In the case of fixing a whole perimeter of the diaphragm 43 to the silicon substrate 42, the binding force of the diaphragm 43 becomes stronger, leading to an increase in spring properties of the diaphragm 43 and a decrease in sensitivity of the acoustic sensor 41. Hence in this embodiment, the diaphragm 43 is supported by the anchors 46 at intervals, to form the vent hole 52 (void) between each of the anchors 46.

The canopy section 44 is formed by providing a fixed electrode plate 49 made of polysilicon on the under surface of a back plate 48 (fixed film) made of SiN. The canopy section 44 is formed in a form, having a hollow portion therebelow and covering the diaphragm 43 with the hollow portion. The minute air gap 50 (void) is formed between the under surface of the canopy section 44 (i.e., the under surface of the fixed electrode plate 49) and the top surface of the diaphragm 43. The fixed electrode plate 49 and the diaphragm 43 are opposed to each other, to constitute a capacitor.

As shown in FIG. 5, in almost the whole of the canopy section 44, a large number of acoustic holes 54 for allowing passage of an acoustic vibration are punched so as to penetrate from the top surface to the under surface. As shown in FIGS. 4 and 5, the acoustic holes 54 are regularly arrayed. In the illustrative example, the acoustic holes 54 are arrayed in triangular form along three directions that form angles of 120° with respect to one another, but the holes may be arranged in rectangular form, concentric form or some other form.

As shown in FIG. 4, a minute stopper 55 (protrusion) in columnar form protrudes from the under surface of the canopy section 44. The stopper 55 protrudes integrally from the under surface of the back plate 48, and penetrates the fixed electrode plate 49 to protrude from the under surface of the canopy section 44. The stopper 55 and the back plate 48 have insulating properties since they are made of SiN. This stopper 55 is one to prevent the diaphragm 43 from adhering to the fixed electrode plate 49 and not being separated therefrom due to electrostatic force.

A protective film 56 is continuously extended from the outer edge of the canopy-like back plate 48 for the whole perimeter thereof. The protective film 56 covers the base section 51 and an area on the outside thereof.

The leading wire 53 is fixed to the base section 51, and a leading wire 57 extracted from the fixed electrode plate 49 is also fixed to the top surface of the base section 51. Meanwhile, the protective film 56 is formed with an opening, through which a movable-side electrode pad 58 is formed on the top surface of the leading wire 53, and the movable-side electrode pad 58 is conducted to the diaphragm 43 through the leading wire 53. Further, a fixed-side electrode pad 59 provided on the top surface of the back plate 48 is conducted to the leading wire 57 via a through hole or the like, and conducted further to the fixed electrode plate 49.

Figure 7:
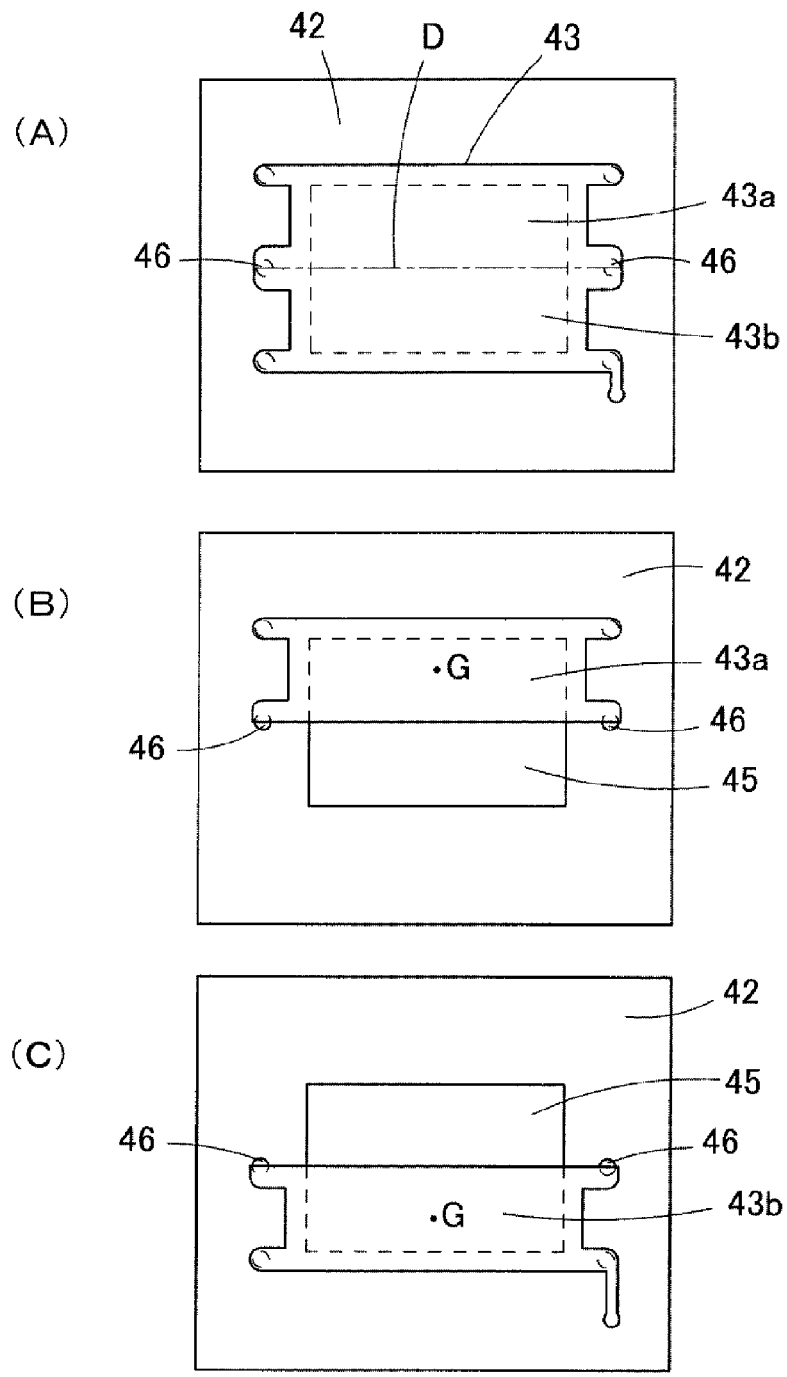
FIGS. 7(A), 7(B) and 7(C) are views each showing an action of a diaphragm in Embodiment 1.

In this acoustic sensor 41, the diaphragm 43 is supported by the anchors 46 not only at the four corners but also supported by the anchors 46 at the centers of short-side edges. That is, the diaphragm 43 is supported by six anchors 46 in grid form. For this reason, the rigidity of the diaphragm 43 is high along a line D (line segment indicated by a dashed line in FIG. 7(A)) that connects between the anchors 46, 46 located at the centers of the respective short sides of the diaphragm 43, and there is a place on the line D where the displacement of the diaphragm 43 is minimal. Therefore, in the diaphragm 43, one area (area surrounded by the four anchors 46 as shown in FIG. 7(B), which is hereinafter referred to as a diaphragm area 43a) and the other area (area surrounded by the four anchors 46 as shown in FIG. 7(C), which is hereinafter referred to as a diaphragm area 43b) can independently vibrate with the line D placed therebetween, and displacement maximal points G, at which the displacement is significantly large, respectively appear inside both diaphragm areas 43a, 43b. Then, one acoustic sensing section 60a is configured of a capacitor made up of the diaphragm area 43a and an area of the fixed electrode plate 49 which is opposed to the diaphragm area 43a. Further, the other acoustic sensing section 60b is configured of a capacitor made up of the diaphragm area 43b and an area of the fixed electrode plate 49 which is opposed to the diaphragm area 43b. Furthermore, both sensing sections 60a, 60b are integrally formed in the same place inside the canopy section 44, and have the same structure, the same form and the same size, substantially having identical characteristics.

In this acoustic sensor 41, when an acoustic vibration passes through the acoustic holes 54 and enters the air gap 50 inside the canopy section 44, the diaphragm areas 43a, 43b as the thin films vibrate in the same phase by the acoustic vibration. When the diaphragm areas 43a, 43b vibrate and an each gap distance between each of the diaphragms 43a, 43b and the fixed electrode plate 49 changes, a capacitance of each of the acoustic sensing sections 60a, 60b changes. This results in that in each of the acoustic sensing sections 60a, 60b, an acoustic vibration (change in sound pressure) being sensed by each of the diaphragms 43a, 43b turns to a change in capacitance between each of the diaphragms 43a, 43b and the fixed electrode plate 49, and is outputted as an electric signal. Further, since both of the diaphragm areas 43a and 43b are connected to the movable-side electrode pad 58 and the fixed electrode plate 49 is common therebetween, the acoustic sensing section 60a (capacitor) and the acoustic sensing section 60b (capacitor) are electrically parallelly connected to each other.

In this acoustic sensor 41, the diaphragm area 43a and the diaphragm area 43b are electrically conducted to each other, and the fixed electrode plate 49 is common therebetween. Furthermore, the acoustic sensing sections 60a, 60b are provided in the same position on the substrate 42, and both sensing sections 60a, 60b sense an acoustic vibration in the same phase. For this reason, even though the diaphragm areas 43a, 43b are almost independent from each other, when they are seen as the whole diaphragm 43, the acoustic sensor 41 functions as one acoustic sensor, and thus remains substantially unchanged from the case when the anchor 46 is not provided at the center of the short side.

As opposed to this, the diaphragm areas 43a, 43b are partitioned by the line D on which the rigidity is high and the displacement is minimal, and thus can act almost independently. Therefore, the diaphragm areas 43a, 43b can be independently displaced on both sides of the line D. Hence thermal noise generated in the acoustic sensing section 60a and thermal noise generated in the acoustic sensing section 60b are sensed as signals in different phases. Therefore, when the noise of each of the sensing sections 60a, 60b is added up, the noise cancels one another, so as to be reduced. This results in improvement in S/N ratio of the acoustic sensor 41.

Figure 8:
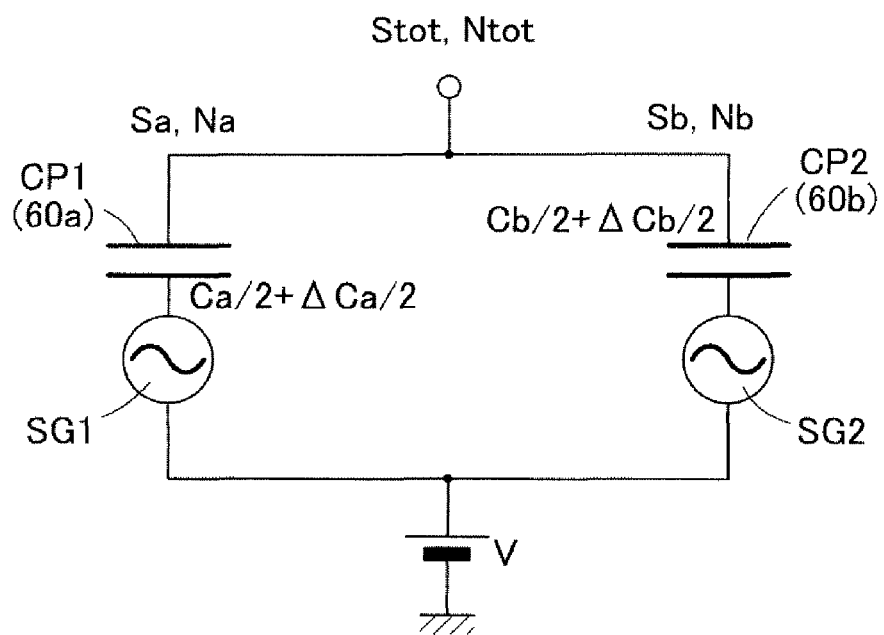
FIG. 8 is a diagram representing an equivalent circuit obtained by simplifying the acoustic sensor.

The reason for improvement in S/N ratio of the acoustic sensor 41 has been briefly described above, and it will further be described hereinafter, using an equivalent circuit. FIG. 8 represents an equivalent circuit obtained by simplifying the acoustic sensor 41. With the anchor 46 provided at the center of the short side, the two separated acoustic sensing sections 60a, 60b can be represented by two parallelly connected variable capacitors CP1, CP2. Herein, the two variable capacitors CP1, CP2 have the same performance. Further, signal generating sources for an acoustic vibration, noise and the like are represented by alternators SG1, SG2 which are serially connected to the variable capacitors CP1, CP2, respectively. Hereby, as shown in FIG. 8, the acoustic sensing section 60a is represented by a circuit configured by serially connecting the variable capacitor CP1 and the alternator SG1, and the acoustic sensing section 60b is represented by a circuit configured by serially connecting the variable capacitor CP2 and the alternator SG2. Further, the acoustic sensor 41 is represented by an equivalent circuit that parallelly connects both serial-connection circuits.

The characteristics or a circuit constant in the equivalent circuit of FIG. 8 are represented by symbols as follows.

Ca/2[F]: capacitance of variable capacitor CP1
Cb/2[F]: capacitance of variable capacitor CP2
ΔCa/2[F]: change in capacitance of variable capacitor CP1 upon reception of pressure
ΔCb/2[F]: change in capacitance of variable capacitor CP2 upon reception of pressure
V[V]: voltage applied to acoustic sensor 41
Sa[V]: sensitivity output of acoustic sensing section 60a
Sb[V]: sensitivity output of acoustic sensing section 60b
Na[V]: noise output of acoustic sensing section 60a
Nb[V]: noise output of acoustic sensing section 60b
Sa/Na: S/N ratio of acoustic sensing section 60a
Sb/Nb: S/N ratio of acoustic sensing section 60b Herein, the sensitivity output is a signal output coming from the acoustic sensing section (or variable capacitor) by an acoustic vibration generated in the alternator, and expressed by: (voltage)×(change in capacitance of fixed capacitor)/(capacitance of fixed capacitor). Therefore, the sensitivity output of the acoustic sensing section 60a is: Sa=V×(ΔCa/2)/(Ca/2)=V×ΔCa/Ca. Similarly, the sensitivity output of the acoustic sensing section 60b is: Sb=V×(ΔCb/2)/(Cb/2)=V×ΔCb/Cb.

Figure 9:
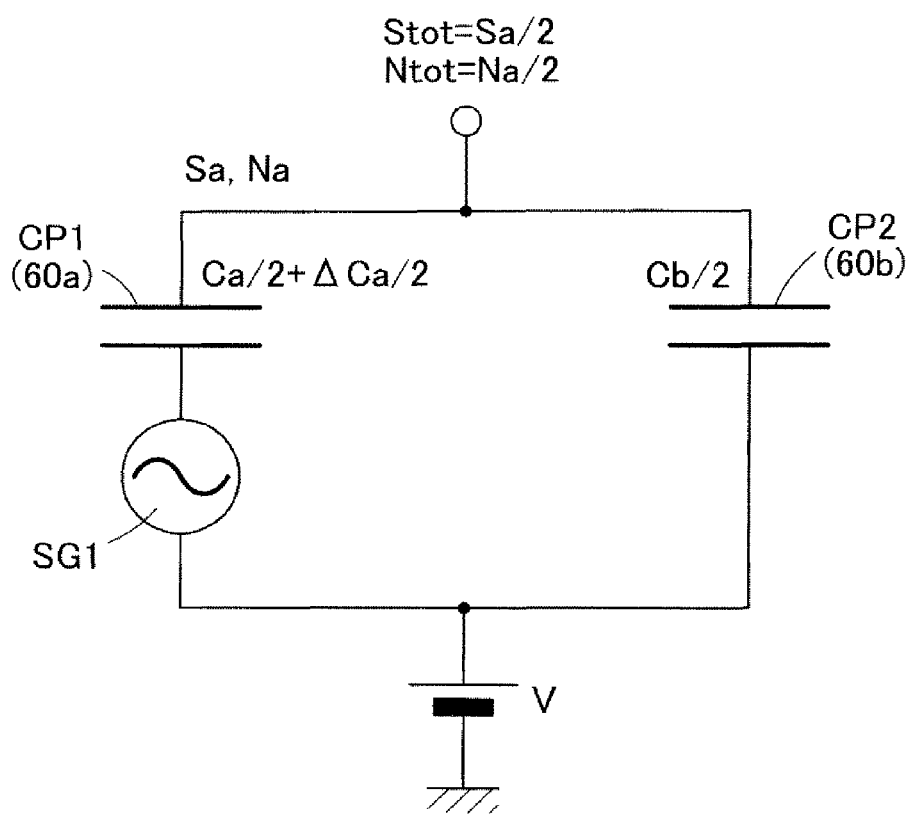
FIG. 9 is an equivalent-circuit diagram representing a state where only one acoustic sensing section is applied with an acoustic vibration and noise.

Herein considered is a state where only the acoustic sensing section 60a is applied with an acoustic vibration and noise, as shown in FIG. 9. In the acoustic sensing section 60b, since a signal due to an acoustic vibration or noise is not generated, the alternator SG2 of the acoustic sensing section 60b is omitted, and it is considered that the capacitance of the variable capacitor CP1 remains unchanged.

First, when only an acoustic vibration is outputted from the alternator SG1, a sensitivity output made from the acoustic sensing section 60a is: Sa=V×ΔCa/Ca, as described above. However, with the capacitor CP2 of the acoustic sensing section 60b parallelly connected to the acoustic sensing section 60a, the capacitor CP2 acts as a parasitic capacitance on the acoustic sensing section 60a, to attenuate the sensitivity of the acoustic sensing section 60a. With the capacitors CP1, CP2 having the same capacitance, a sensitivity output Stot made from the acoustic sensor 41 (i.e., sensitivity output that is inputted into the signal processing circuit) is reduced into half as expressed in the following formula.

$$Stot=[(Ca/2)/\{(Ca/2)+(Cb/2)\}]\times Sa=Sa/2$$

Next, the case is considered where only noise is outputted from the power source SG1. Also in this case, when a noise output made from the acoustic sensing section 60a is Na, due to an influence of the capacitor CP2 parallelly connected to the acoustic sensing section 60a, a noise output Ntot made from the acoustic sensor 41 (i.e., noise output that is inputted into the signal processing circuit) is reduced into half as expressed in the following formula.

$$Ntot=[(Ca/2)/\{(Ca/2)+(Cb/2)\}]\times Na=Na/2$$

In a state where only the acoustic sensing section 60b is applied with an acoustic vibration as opposed to FIG. 9, considering this state as in the case of FIG. 9, the sensitivity output Stot made from the acoustic sensor 41 is expressed as in the following formula where a sensitivity output Sb of the acoustic sensing section 60b is reduced into half.

$$Stot=[(Cb/2)/\{(Cb/2)+(Ca/2)\}]\times Sb=Sb/2$$

Further, considering a state where noise is generated only in the acoustic sensing section 60b, due to an influence of the capacitor CP1 of the acoustic sensing section 60a, a noise output Ntot made from the acoustic sensor 41 is expressed by the following formula where a noise output Nb of the acoustic sensing section 60b is reduced into half.

$$Ntot=[(Cb/2)/\{(Cb/2)+(Ca/2)\}]\times Nb=Nb/2$$

Next, a case is considered where the sensitivity outputs Sa, Sb and the noise outputs Na, Nb are simultaneously generated in the acoustic sensing sections 60a, 60b, as shown in FIG. 8. The sensitivity output and the noise output are separately considered. As for the sensitivity output, with the respective diaphragms areas 43a, 43b arranged in highly proximate positions inside the same canopy section 44, both diaphragms 43a, 43b are vibrating in the same phase and amplitude at the same time. Furthermore, the variable capacitor CP1 of the acoustic sensing section 60a and the variable capacitor CP2 of the acoustic sensing section 60b are parallelly connected to each other. As a result, the sensitivity output Stot of the acoustic sensor 41 is obtained as a sum of the sensitivity outputs Sa/2, Sb/2 of the respective acoustic sensing sections 60a, 60b, having been obtained above.

$$Stot=Sa/2+Sb/2$$

Herein, with Sa=Sb, the above formula is expressed as Stot=Sa. This represents that, as shown in FIGS. 10(A) to 10(C), one obtained by superimposition of two signals (sensitivity outputs Sa/2, Sb/2 of FIGS. 10(A) and 10(B)) having the same phase and amplitude is outputted as the whole sensitivity output Stot=Sa (FIG. 10(C)) in the acoustic sensor 41, indicating that, even though the acoustic sensor 41 is separated into the acoustic sensing sections 60a, 60b, the sensitivity output Stot of the acoustic sensor 41 remains unchanged from the case where the anchor 46 is not provided at the center of the short side of the diaphragm 43.

Figure 11:
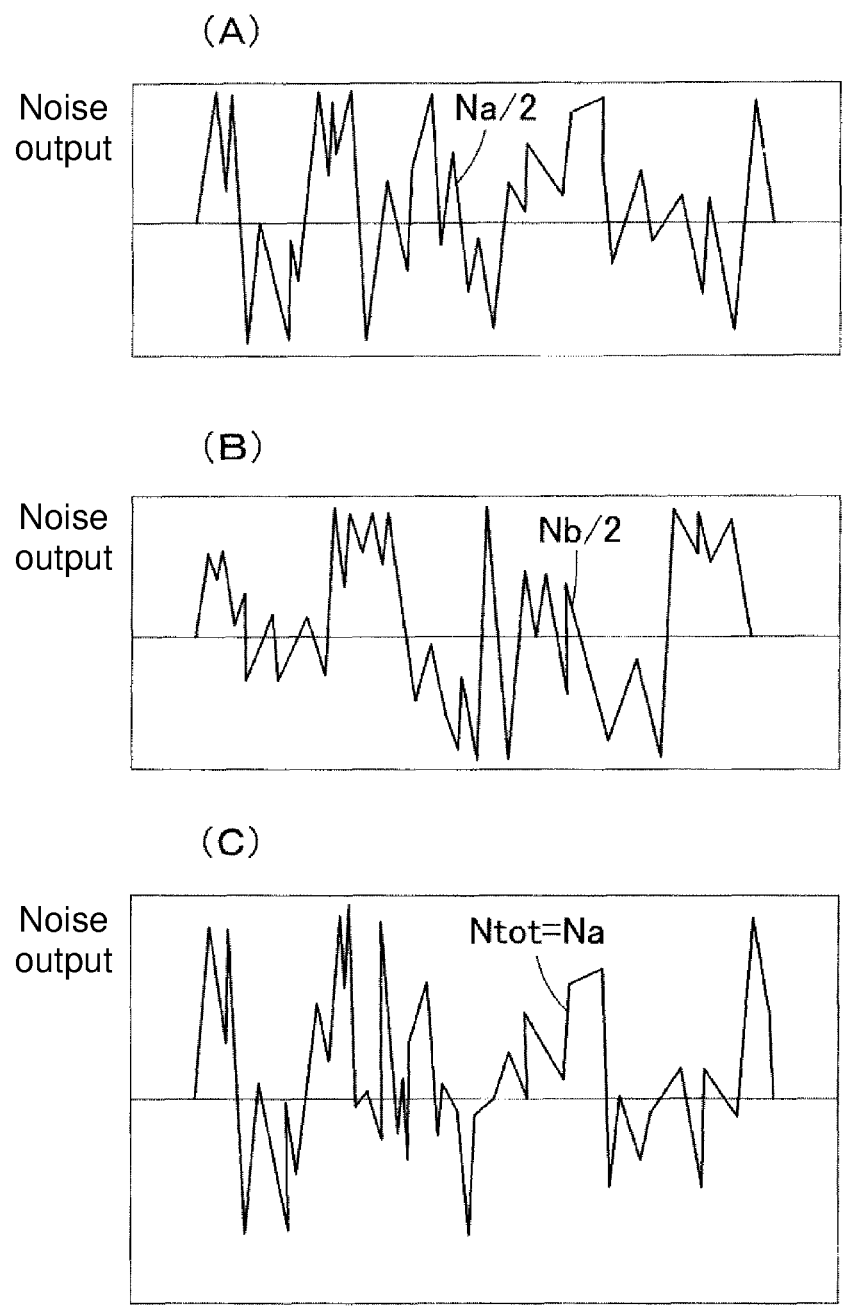
FIG. 11(A) is a waveform diagram showing a noise signal outputted from the acoustic sensor when noise is generated only in one acoustic sensing section.
FIG. 11(B) is a waveform diagram showing a noise signal outputted from the acoustic sensor when noise is generated only in the other acoustic sensing section.
FIG. 11(C) is a waveform diagram showing a noise signal outputted from the acoustic sensor when noise is simultaneously generated in both acoustic sensing sections.

On the other hand, since noise is derived from thermal noise, noise is independently generated at random in each of the acoustic sensing sections 60a, 60b which are separated from each other. For this reason, noise of the acoustic sensing section 60a and noise of the acoustic sensing section 60b serve as independent signals having non-uniform phases and amplitudes, as shown in FIGS. 11(A) and 11(B). Hence, as shown in FIG. 11(C), the noise output Ntot made from the acoustic sensor 41 is obtained by computing at the time of performing addition of dispersions of the noise output Na/2 made from the acoustic sensing section 60a and the noise output Nb/2 made from the acoustic sensing section 60b. That is, it is obtained as in the following formula.

$$Stot=\sqrt{\{(Na/2)^2+(Nb/2)^2\}}$$

Herein, with Na=Nb, the above formula is expressed as: Stot=Na/$\sqrt{(2)}$.

As described above, the sensitivity output Stot of the acoustic sensor 41 is added, and the noise output Ntot thereof is obtained by computing at the time of performing an addition of dispersions. As a result, the S/N ratio of the acoustic sensor 41 is $\sqrt{(2)}$Sa/Na, and as compared with the case of the acoustic sensor 41 not being separated into the acoustic sensing sections 60a, 60b, the S/N ratio becomes $\sqrt{(2)}$ times as large (or improves by 3 dB). According to a prototype, no change was seen in sensitivity output before and after provision of the anchor 46 at the center of the short side of the diaphragm 43, whereas the noise output decreased by 3 dB due to the provision of the anchor 46 at the center of the short side of the diaphragm 43. Therefore, the S/N ratio increased by the order of +3 dB by the separation into the acoustic sensing sections 60a, 60b.

Accordingly, it was quantitatively shown that the S/N ratio of the acoustic sensor 41 can be improved by increasing the number of anchors 46 and making them support the diaphragm 43 at extra places for the separation into the acoustic sensing sections 60a, 60b.

Second Embodiment

Figure 12:
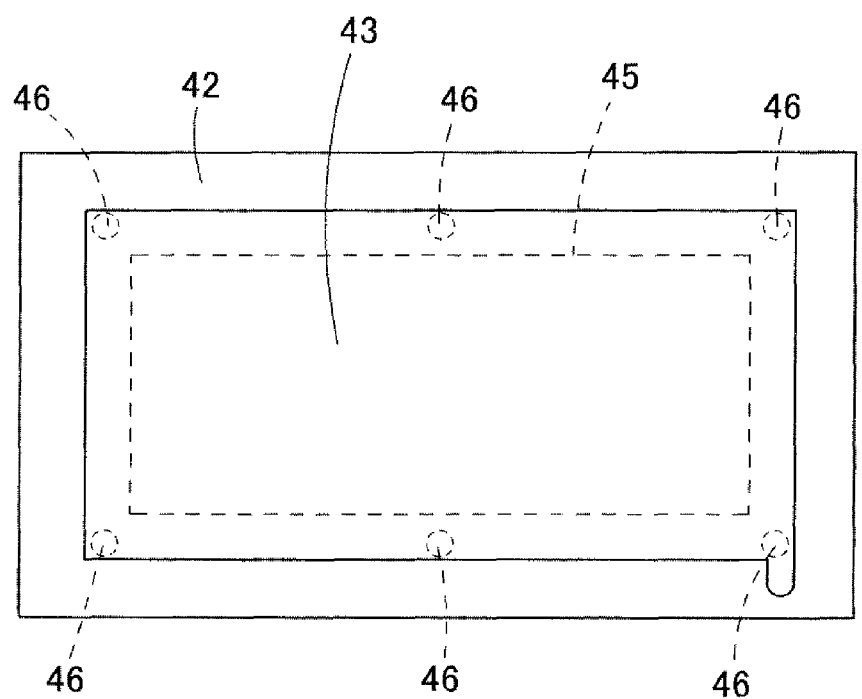
FIG. 12 is a plan view showing a form of a diaphragm according to Embodiment 2 of the present invention.

Next, an acoustic sensor according to Embodiment 2 of the present invention will be described. FIG. 12 is a plan view showing a structure of the diaphragm 43 of Embodiment 2 for use in the acoustic sensor. Since the structures of the canopy section 44 and the others are similar to those in Embodiment 1, descriptions thereof will be omitted.

In this embodiment, the diaphragm 43 is formed in substantially rectangular form. The diaphragm 43 is supported by a total of six anchors 46 at four corners and at the centers of long-side edges on the silicon substrate 42. That is, both ends of the short side of the diaphragm 43 are supported by the anchors 46 at two places, and both ends and the center of the long side thereof are supported by the anchors 46 at three places.

Figure 13:
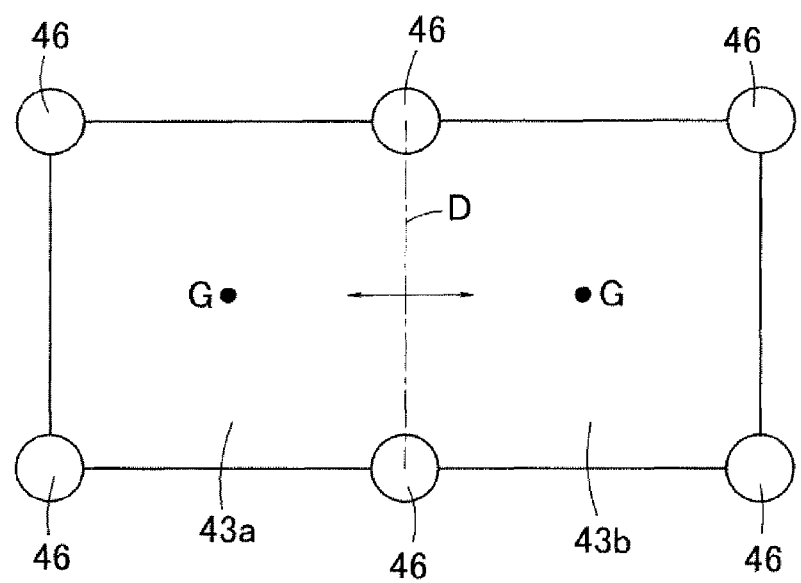
FIG. 13 is a diagram schematically showing a function of the diaphragm of Embodiment 2.

Even in such a form, as shown in FIG. 13, the rigidity of the diaphragm 43 is high on the line D that connects between the anchors 46 located at the centers of the long-side edges, and the displacement is thus minimal on the line D. Further, the center of each of the diaphragm areas 43a, 43b on both sides of the line D is the displacement maximal point G at which the displacement is large. Therefore, the diaphragm areas 43a, 43b located on both sides of the line D respectively serve as independent vibration films. Further, these diaphragm areas 43a, 43b and the fixed electrode plate 49 constitute two acoustic sensing sections which are independent from each other. Hereby, the S/N ratio can be increased even in the acoustic sensor of Embodiment 2 as in the case of Embodiment 1 so long as the two acoustic sensing sections are parallelly connected to each other.

In the acoustic sensor of the present invention, one capacitor structure configured as a unit is separated into a plurality of parts (acoustic sensing sections 60a and 60b) having independent vibration modes. That is, it is configured such that the diaphragm is separated into a plurality of areas, and the independent displacement maximal point G is generated inside each of the separated areas.

For this reason, in some embodiment (e.g. Embodiments 1, 2) of the present invention, the anchor 46 is provided on the line D set in an orthogonal direction to a line that connects between the displacement maximal points G in the respective separated diaphragm areas 43a, 43b, to support the diaphragm 43, as shown in FIG. 13. With such a structure, on the position of the line D that connects between the anchors 46 at the centers, the rigidity of the diaphragm 43 increases and the displacement becomes minimal. With the line D passing between one displacement maximal point G and the other displacement maximal point G, the displacement resists being transmitted from one displacement maximal point G to the other displacement maximal point G as indicated by an arrow in FIG. 13, thereby allowing enhancement of the independency of the acoustic sensing section. With such a structure, the plurality of acoustic sensing sections can operate in the same phase upon simultaneous receipt of sound pressure, and can operate independently of each other with respect to self-generated noise.

However, in the embodiment of the present invention, the plurality of acoustic sensing sections should not necessarily have the same structure and the same size, but the acoustic sensing sections may have different structures or different sizes and thus have different characteristics.

Figure 14:
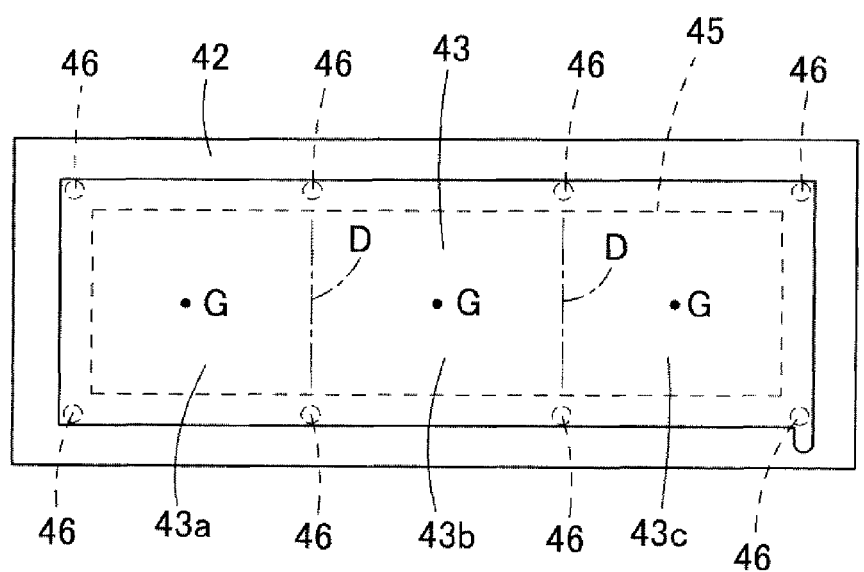
FIG. 14 is a plan view showing a form of a diaphragm in a modified example of Embodiment 2.

FIG. 14 is a modified Example of Embodiment 2. In the modified example of FIG. 14, the diaphragm 43 in substantially rectangular form is supported by the anchors 46 arranged in grid form. That is, both ends of the short side of the diaphragm 43 are supported by the anchors 46 at two places, and both ends and points therebetween of the long side of the diaphragm 43 are supported by a plurality of (four or more) anchors 46. Also in this case, the displacement of the diaphragm 43 is small on the line D that connects between the opposing anchors 46. Therefore, the diaphragm 43 is separated by a plurality of lines D into three diaphragm areas 43a, 43b, 43c in rectangular form whose midsection is the displacement maximal point G and which is supported by the anchors 46 at four corners. Further, these diaphragm areas 43a, 43b, 43c and the fixed electrode plate 49 constitute a plurality of independent acoustic sensing sections.

Increasing the number of acoustic sensing sections (the form and area of each diaphragm may be different) can reduce noise of the acoustic sensor, so as to enhance the effect to improve the S/N ratio.

Third Embodiment

Figure 15:
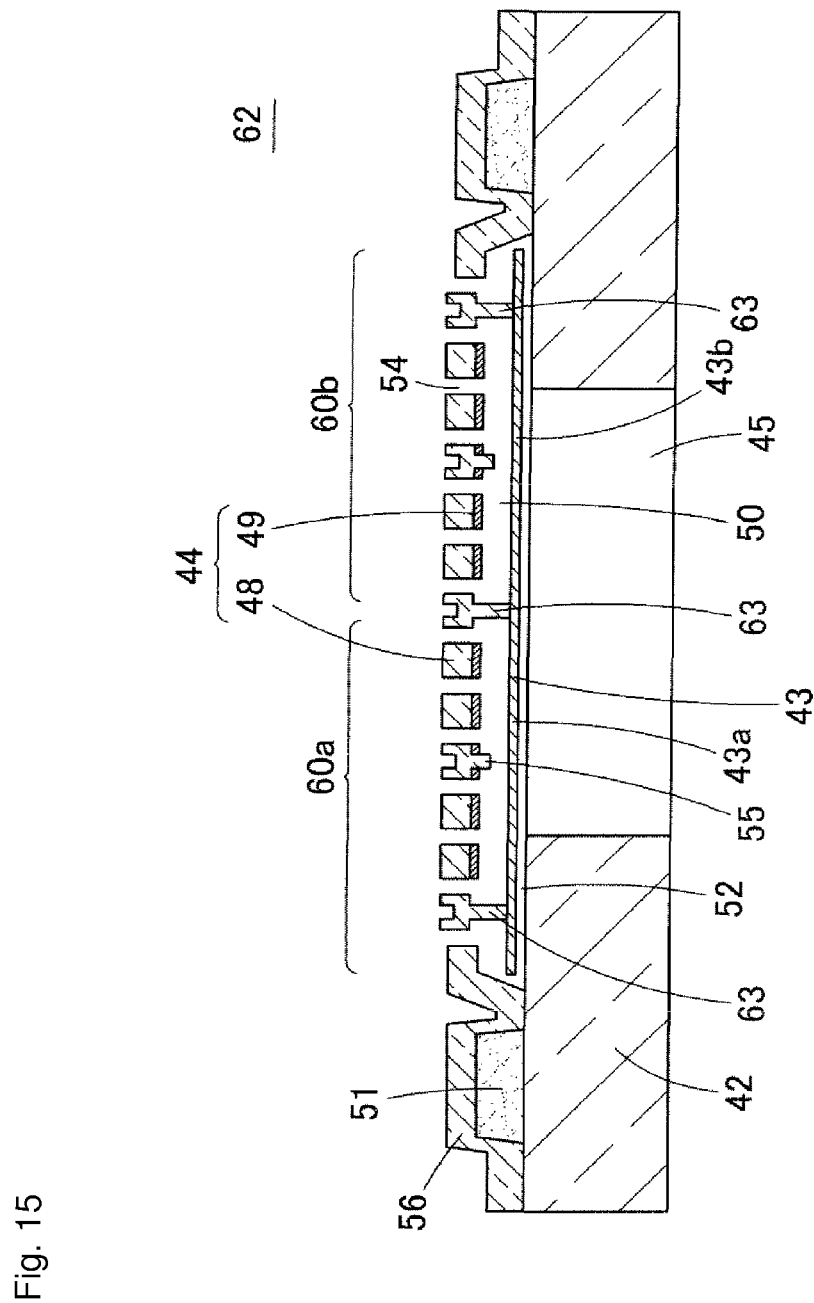
FIG. 15 is a sectional view of an acoustic sensor according to Embodiment 3 of the present invention.
Figure 16:
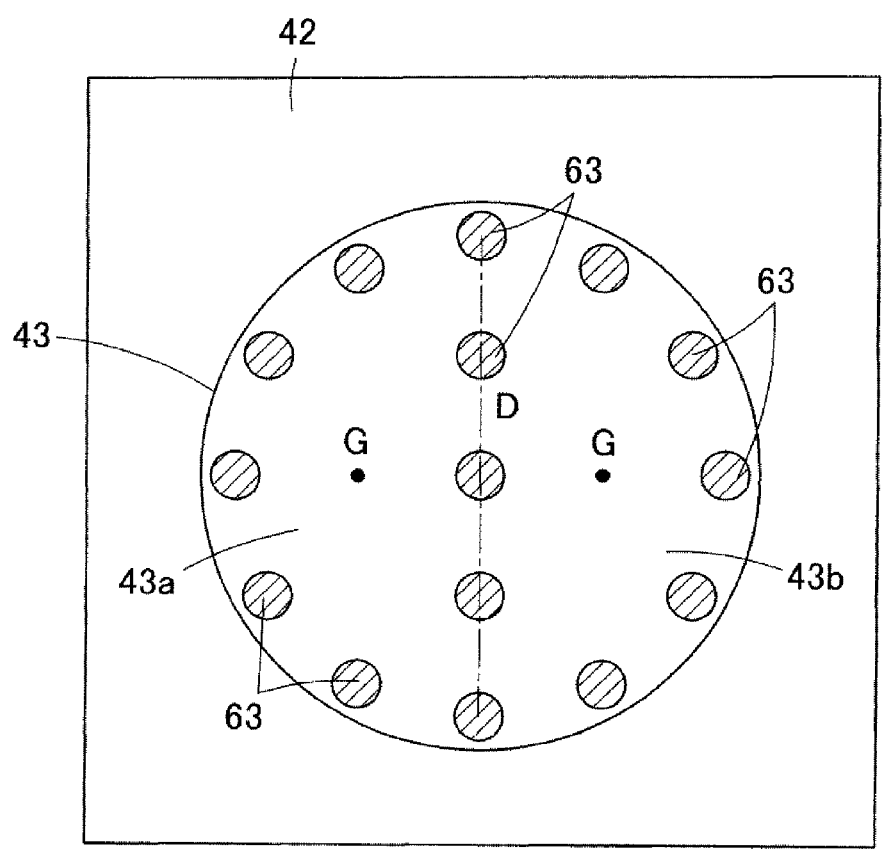
FIG. 16 is a plan view showing a form of a diaphragm in Embodiment 3.

FIG. 15 is a sectional view of an acoustic sensor 62 according to Embodiment 3 of the present invention. FIG. 16 is a plan view of the diaphragm 43 for use in the acoustic sensor 62 of Embodiment 3.

In the acoustic sensor 62 of Embodiment 3, the diaphragm 43 is not supported by the anchors 46 as in Embodiment 1, but is just placed on the top surface of the silicon substrate 42. On the other hand, from a position opposed to the diaphragm 43 out of the under surface of the back plate 48, the anchors 63 (supporting sections) to be brought into contact with the top surface of the diaphragm 43 protrude downward. Therefore, when a voltage is applied to between the diaphragm 43 and the fixed electrode plate 49, the diaphragm 43 is pulled up by electrostatic attractive force toward the fixed electrode plate 49. The diaphragm 43 having been pulled upward comes into contact with the lower end surface of the anchor 63 and fixed thereto, and the air gap 50 is formed at regular intervals between the diaphragm 43 and the fixed electrode plate 49. Upon application of an acoustic vibration to this diaphragm 43, a capacitance of the capacitor configured of the diaphragm 43 and the fixed electrode plate 49 changes, and the acoustic vibration is thus detected.

As shown in FIG. 16, the diaphragm 43 has a disk form. The anchors 63 that protrude from the back plate 48 are arranged at regular intervals along the outer peripheral rim of the diaphragm 43. Further, a plurality of anchors 63 are arrayed at regular intervals between a pair of anchors 63 opposed to each other with the center of the diaphragm 43 placed at the center therebetween.

In such an acoustic sensor 62, the displacement of the diaphragm 43 is minimal on the line D along a plurality of anchors 63 linearly arrayed along a diameter of the diaphragm 43, and the displacement maximal points G are respectively generated on both side of the line D. Further, a direction of the anchors 63 aligned in a row on the diameter (direction of the line D) is orthogonal to a direction connecting between the displacement maximal points G. Therefore, the independent diaphragm areas 43a, 43b are formed on both sides of the line D. Hence these diaphragm areas 43a, 43b and the fixed electrode plate 49 constitute a plurality of independent acoustic sensing sections. This can result in improvement in S/N ratio also in the acoustic sensor 62 as thus described.

In addition, although five anchors 63 are arrayed in the orthogonal direction to the direction connecting between the displacement maximal points G with respect to the disk-like diaphragm 43 in the illustrative example shown in FIG. 16, four or more anchors 63 are essentially only arrayed. Further, in the case of the diaphragm in non-rotationally symmetric form such as a rectangular diaphragm, three or more anchors are essentially only arrayed in the orthogonal direction to the direction connecting between the displacement maximal points G.

Fourth Embodiment

Figure 17:
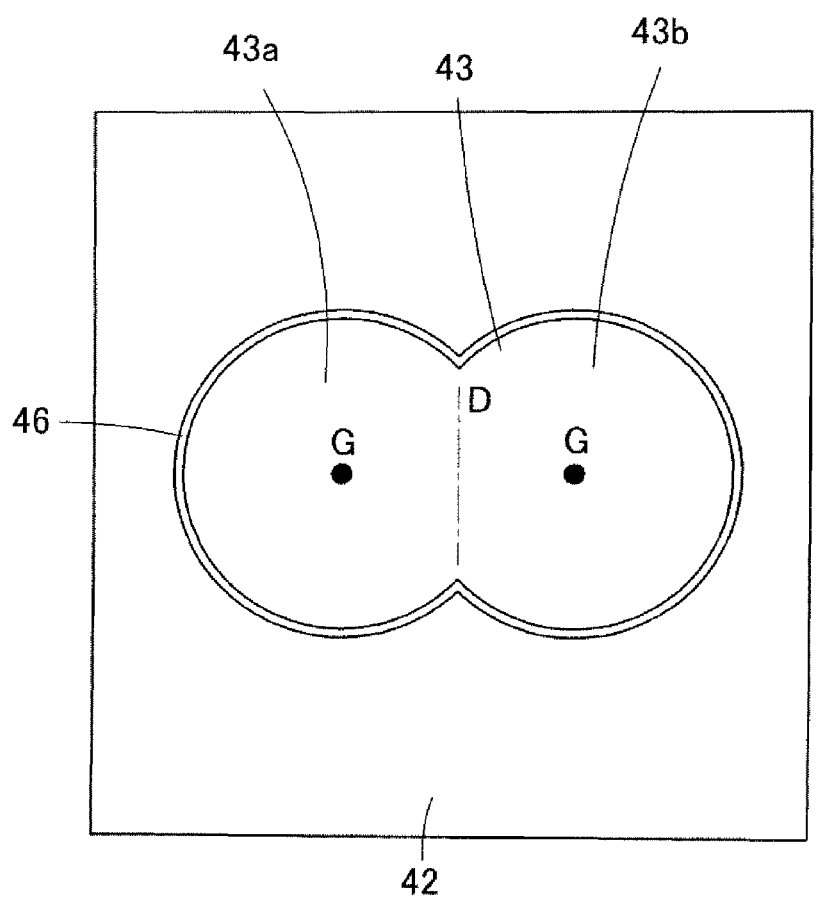
FIG. 17 is a plan view showing a form of a diaphragm in Embodiment 4 of the present invention.

FIG. 17 is a plan view showing a structure of the diaphragm 43 for use in an acoustic sensor according to Embodiment 4 of the present invention. This diaphragm 43 has a form with an inwardly constricted longitudinal midsection, and a whole periphery thereof is fixed by the silicon substrate 42 by a continuous anchor 46. Since the rigidity of the diaphragm 43 increases in the place constricted and thus reduced in width, both sides of the line D along a constricted direction become independently vibratable diaphragms 43a, 43b. Either of the diaphragm areas 43a, 43b has a partially notched disk-like form, where the displacement maximal points G are respectively generated, and a direction connecting between the displacement maximal points G is orthogonal to the line D. Therefore, also in such a form, the diaphragm areas 43a, 43b and the fixed electrode plate 49 constitute a plurality of independent acoustic sensing sections. This can result in improvement in S/N ratio also in the acoustic sensor 62 as thus described.

In addition, Embodiments 3 and 4 can also be applied to the diaphragm in rectangular form. Further, for example in Embodiment 2, the anchor 46 located at the center of the long side may be shifted inward relative to the diaphragm 43. This makes a distance between the anchors 46 located at the center of the long side shorter than one shown in FIG. 12, so as to increase the rigidity of the diaphragm 43 in a direction along the line D.

Fifth Embodiment

Figure 18:
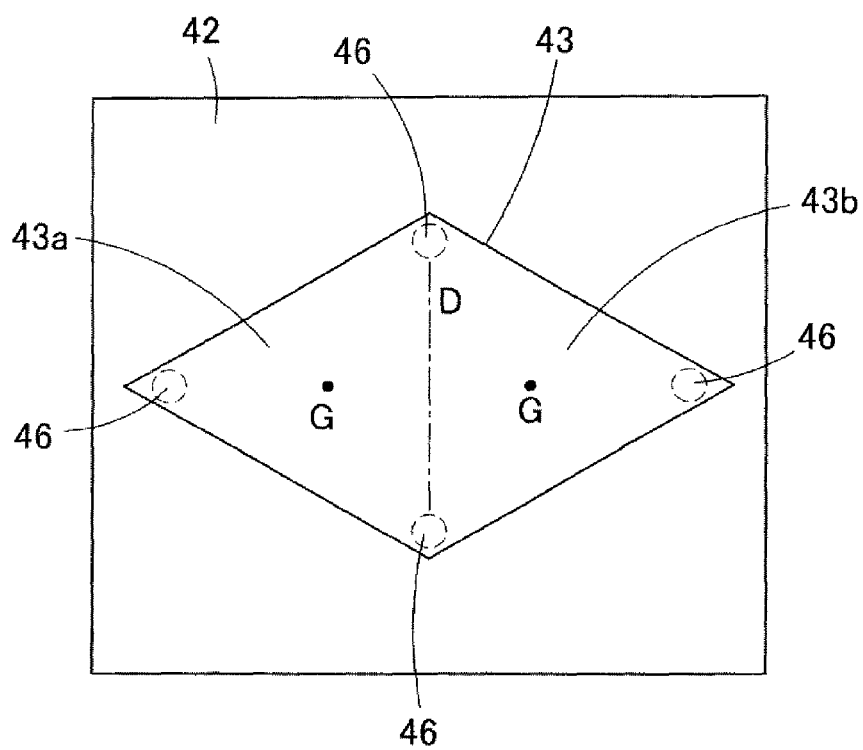
FIG. 18 is a plan view showing a form of a diaphragm in Embodiment 5 of the present invention.

FIG. 18 is a plan view showing a structure of the diaphragm 43 for use in an acoustic sensor according to Embodiment 5 of the present invention. This diaphragm has a diamond form, and is supported by the anchors 46 at four corners. In the case of such a diaphragm 43, the displacement of the diaphragm 43 is minimal on the line D located on a shorter diagonal line of the diaphragm 43 in diamond form. Further, since this diaphragm 43 respectively have the displacement maximal points G at which the displacement is maximal on both sides of the line D, both sides of the line D are independently vibratable diaphragms 43a, 43b.

Sixth Embodiment

Figure 19:
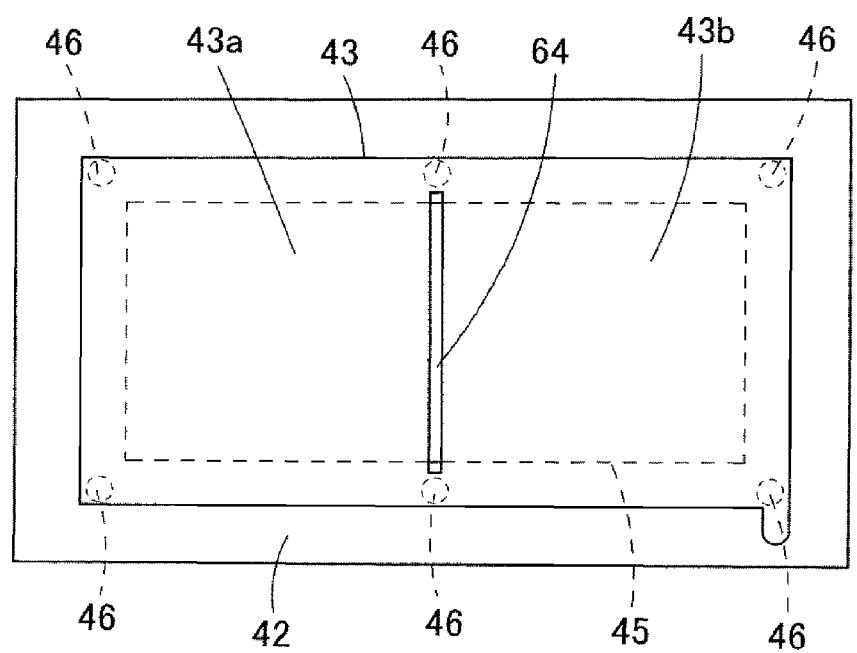
FIG. 19 is a plan view showing a form of a diaphragm in Embodiment 6 of the present invention.

FIG. 19 is a plan view showing a structure of the diaphragm 43 for use in an acoustic sensor according to Embodiment 6 of the present invention. In this embodiment, in the diaphragm 43 (cf. FIG. 12) of Embodiment 2, a slit 64 is provided in the diaphragm 43 along a position of the line D. Providing the slit 64 along the line D in such a manner enhances the independency of the diaphragm area 43a and the diaphragm area 43b, so as to increase the effect of improvement in S/N.

A length of this slit 64 desirably crosses not less than 50% of the width of the diaphragm 43. That is, the length of the slit 64 is desirably a length not smaller than a half of the width of the diaphragm 43. This is because the slit 64 is provided for the purpose of isolating the displacement on the diaphragm area 43a side and the displacement on the diaphragm area 43b side from each other so as to make them discontinuous, and if the length of the slit 64 is smaller than a half of the width of the diaphragm 43, the discontinuity of the displacements on the diaphragm 43a side and the diaphragm area 43b side is impaired.

Further, a width of the slit 64 is desirably not larger than 10 μm. This is because, if the width of the slit 64 is excessively large, an amount of air, which leaks from the air gap 50 to the back chamber 45 through the slit 64, increases and the roll-off frequency increases, leading to deterioration in low-frequency characteristics of the acoustic sensor. Especially when the width of the slit 64 exceeds 10 μm, the roll-off frequency becomes significantly high and the low-frequency characteristics deteriorate, to cause greatly impaired sensitivity of the acoustic sensor 41.

Figure 20:
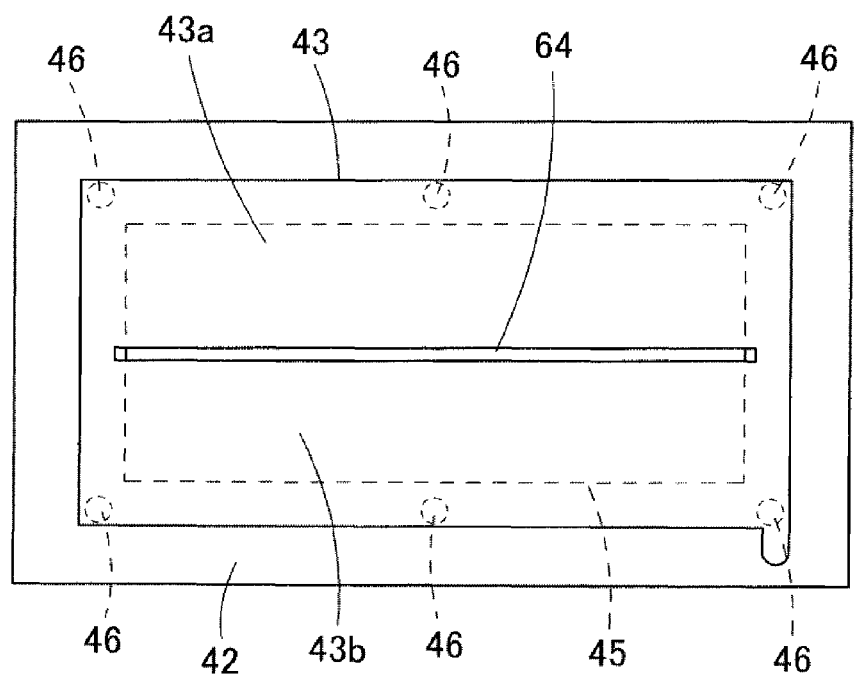
FIG. 20 is a plan view showing a diaphragm with a different form in Embodiment 6.
Figure 21:
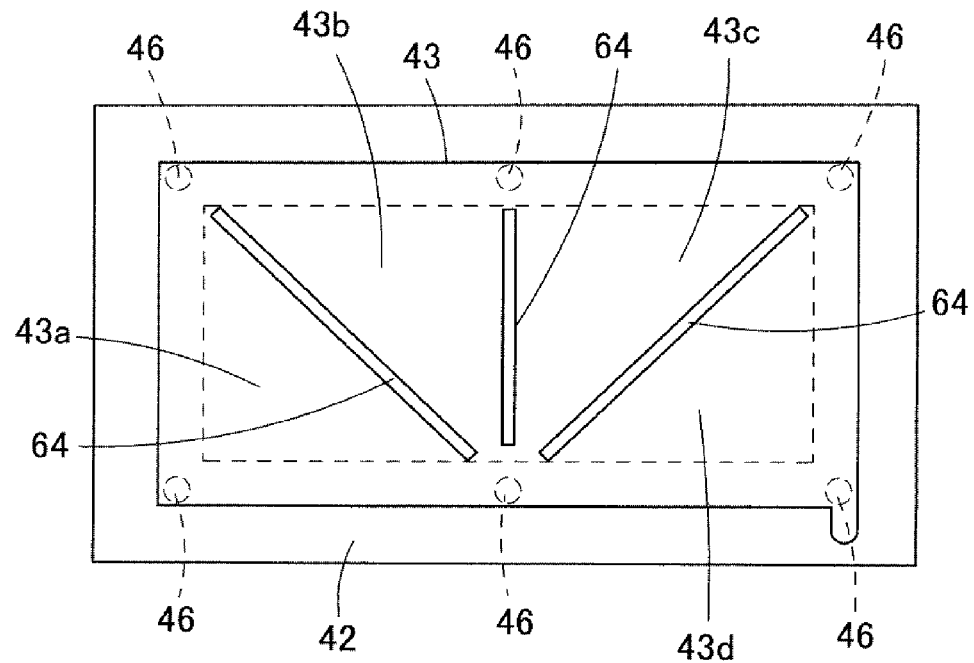
FIG. 21 is a plan view showing a diaphragm with a further different form in Embodiment 6.

However, the position of the slit 64 is not necessarily restricted to the position of the line D. For example, as shown in FIG. 20, the slit 64 is provided so as to be orthogonal to the line D, to form the diaphragm areas 43a, 43b on both sides thereof. Further, as shown in FIG. 21, a plurality of slits 64 are provided in the diaphragm 43, to form three or more diaphragm areas 43a, 43b, 43c, 43d.

Seventh Embodiment

Figure 22:
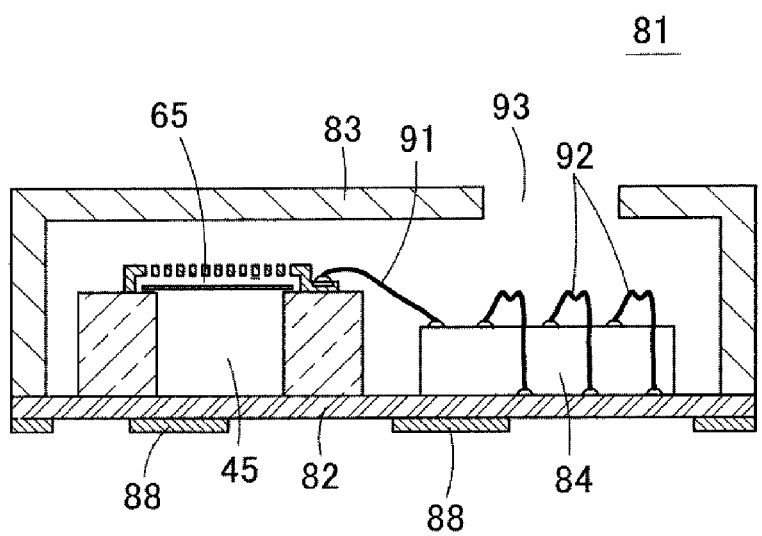
FIG. 22 is a sectional view of a microphone according to Embodiment 7 of the present invention.
Figure 23:
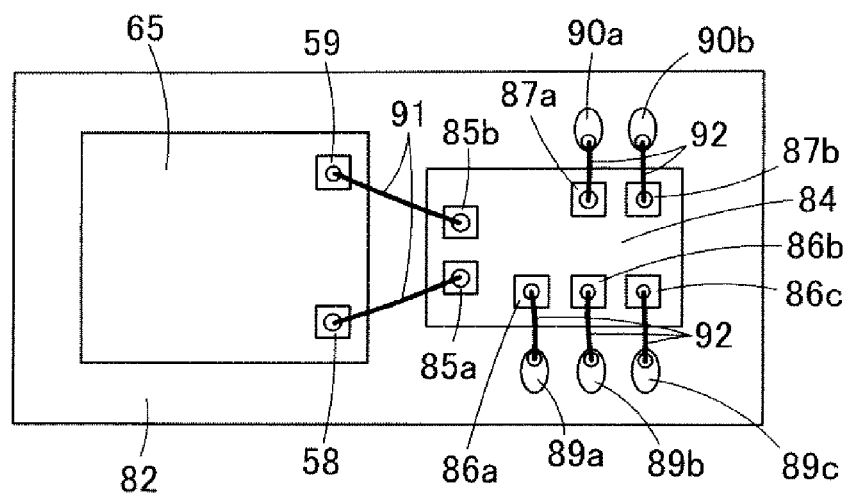
FIG. 23 is a plan view of a state where a cover of the microphone of Embodiment 7 has been removed.

FIG. 22 is a sectional view of an MEMS microphone using an acoustic sensor of each of the above embodiments. Further, FIG. 23 is a plan view of the microphone in a state where a cover has been removed.

This microphone 81 is one formed by housing an acoustic sensor 65 and a signal processing circuit 84 (ASIC) inside a package made up of a circuit substrate 82 and a cover 83. The acoustic sensor 65 and the signal processing circuit 84 are mounted on the top surface of the circuit substrate 82. Electrode pads 58, 59 of the acoustic sensor 65 are respectively connected to pads 85a, 85b of the signal processing circuit 84 by bonding wires 91. A plurality of terminals 88 for electrically connecting the microphone 81 and the outside are provided on the under surface of the circuit substrate 82, and electrode sections 89a to 89c, 90a, 90b, which are conducted with the terminal 88, are provided on the top surface of the circuit substrate 82. Respective pads 86a to 86c, 87a, 87b of the signal processing circuit 84 mounted on the circuit substrate 82 are respectively connected to the electrode sections 89a to 89c, 90a, 90b by bonding wires 92. It is to be noted that the pad of the signal processing circuit 84 has a function of supplying power to the acoustic sensor 65, and a function of outputting a capacitance change signal of the acoustic sensor 65 to the outside.

The cover 83 is attached to the top surface of the circuit substrate 82 so as to cover the acoustic sensor 65 and the signal processing circuit 84. A sound introduction port 93 for introducing an acoustic vibration into the package is opened on the top surface of the cover 83. Further, the package has a function of an electromagnetic shield, protecting the microphone 81 from electric disturbance and mechanical shock from the outside.

Therefore, an acoustic vibration having entered the package through the sound introduction port 93 is detected by the acoustic sensor 65 and subjected to predetermined signal processing by the signal processing circuit 84, and is then outputted. Herein, with the acoustic sensor according to the present invention being in use as the acoustic sensor 65, the microphone 81 with a high S/N ratio is formed.

Figure 24:
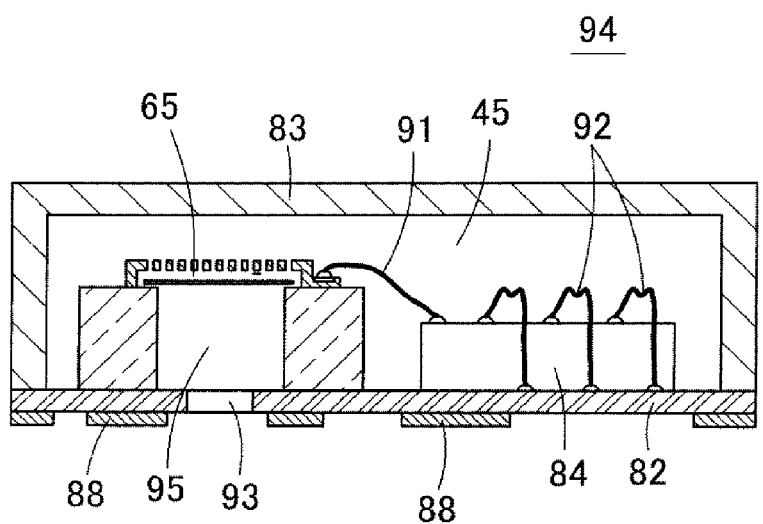
FIG. 24 is a sectional view showing a microphone with a different structure in Embodiment 7.

In addition, FIG. 24 shows a microphone 94 with a different structure. In this microphone 94, the sound introduction port 93 is opened not in the cover 83 but in the circuit substrate 82 in a position opposed to the under surface of the hollow section of the silicon substrate 42. In this microphone 94, with an acoustic vibration introduced through the sound introduction port 93 of the circuit substrate 82, the hollow section of the silicon substrate 42 serves as a front chamber 95, and the space inside the package serves as the back chamber 45. According to such a form, the volume of the back chamber 45 can be increased, so as to further improve the sensitivity of the microphone 81.

Last but not least, how the displacement maximal point appears in the diaphragm is not decided only based on arrangement of the anchors (supporting sections), but also on a material or a thickness of the diaphragm, a size of the anchor (supporting section) or the like.

DESCRIPTION OF SYMBOLS 41, 61, 62, 65 acoustic sensor
42 silicon substrate
43 diaphragm
43a, 43b diaphragm area
45 back chamber
46, 63 anchor
48 back plate
49 fixed electrode plate
60a, 60b acoustic sensing section
64 slit

The invention claimed is:
1. An acoustic sensor, comprising:
a substrate having a hollow section;
a thin film-like diaphragm, arranged above the substrate so as to cover the hollow section;
a movable electrode plate, formed on the diaphragm;
a back plate, fixed to a top surface of the substrate so as to be opposed to the diaphragm; and
a fixed electrode plate, provided on the back plate in a position opposed to the movable electrode plate,
characterized in that
the diaphragm is supported along a periphery of the diaphragm on the substrate or the back plate by a plurality of supporting sections,
the diaphragm has points, at which a displacement amount is maximal at a time of vibration,
the plurality of supporting sections supports the periphery of the diaphragm on both sides of the diaphragm segmented by a line segment connecting between adjacent maximal points at which the displacement amount of the diaphragm is maximal, and
the plurality of supporting sections supports the periphery of the diaphragm in an area of the diaphragm between the adjacent maximal points.
2. The acoustic sensor according to claim 1, wherein the diaphragm has a plurality of outwardly extended beam sections, and
each beam section is supported by the supporting sections.
3. The acoustic sensor according to claim 1, wherein the diaphragm has a rectangular form.
4. The acoustic sensor according to claim 3, wherein the diaphragm is supported by the plurality of the supporting sections arranged in grid form.
5. The acoustic sensor according to claim 4, wherein the diaphragm is supported by the supporting sections at four corners, and is further supported by the supporting sections located at an intermediate portion between the corners, and the intermediate portion is located on opposite sides of the rectangular form of the diaphragm.
6. The acoustic sensor according to claim 1, wherein the diaphragm is further supported by at least three supporting sections along a straight line intersecting with the line segment connecting between the adjacent maximal points at which the displacement amount of the diaphragm is maximal.
7. The acoustic sensor according to claim 1, wherein the plurality of supporting sections is located on a straight line intersecting with the line segment connecting between the adjacent maximal points and distance between the plurality of supporting sections located on the straight line intersecting with the line segment is shorter than distance between two supporting sections located at opposite corners of the diaphragm.

8. The acoustic sensor according to claim 7, wherein a whole perimeter of a periphery of the diaphragm is supported by the supporting sections provided on the substrate or the back plate.

9. The acoustic sensor according to claim 1, wherein the diaphragm is divided by a slit.

10. The acoustic sensor according to claim 9, wherein the slit is formed in the diaphragm on a line that connects between two of said supporting sections.

11. The acoustic sensor according to claim 9, wherein a width of the slit is not larger than 10 μm.

12. The acoustic sensor according to claim 9, wherein length of the slit is not smaller than a half of a diameter of the diaphragm.

13. The acoustic sensor according to claim 1, wherein a void is formed between the diaphragm and the substrate in at least one place between adjacent supporting sections.

14. The acoustic sensor according to claim 1, wherein an acoustic vibration reaches the diaphragm through the hollow section.

15. A microphone, provided with the acoustic sensor according to claim 1; and a circuit for processing a signal outputted from the acoustic sensor.

* * * * *